(12) United States Patent
Chi et al.

(10) Patent No.: US 8,426,955 B2
(45) Date of Patent: Apr. 23, 2013

(54) INTEGRATED CIRCUIT PACKAGING SYSTEM WITH A STACK PACKAGE AND METHOD OF MANUFACTURE THEREOF

(75) Inventors: HeeJo Chi, Ichon si (KR); YeongIm Park, Suwon (KR); HyungMin Lee, Bucheon-si (KR)

(73) Assignee: STATS Chippac Ltd., Singapore (SG)

( * ) Notice: Subject to any disclaimer, the term of this patent is extended or adjusted under 35 U.S.C. 154(b) by 736 days.

(21) Appl. No.: 12/484,158

(22) Filed: Jun. 12, 2009

(65) Prior Publication Data

US 2010/0314738 A1    Dec. 16, 2010

(51) Int. Cl.
*H01L 23/28* (2006.01)

(52) U.S. Cl.
USPC ............ 257/686; 257/787; 257/E21.502; 257/E23.116; 438/107; 438/118; 438/124; 438/127

(58) Field of Classification Search ........... 257/787, 257/E21.502, E23.116, 686; 438/118, 124, 438/127, 107
See application file for complete search history.

(56) References Cited

U.S. PATENT DOCUMENTS

| | | |
|---|---|---|
| 7,253,511 B2 | 8/2007 | Karnezos et al. |
| 7,298,037 B2 | 11/2007 | Yim et al. |
| 2008/0142957 A1 | 6/2008 | Wang et al. |
| 2008/0237825 A1 | 10/2008 | Tay et al. |
| 2009/0224390 A1 | 9/2009 | Yang et al. |
| 2010/0090350 A1* | 4/2010 | Chow et al. ............ 257/777 |

* cited by examiner

*Primary Examiner* — Zandra Smith
*Assistant Examiner* — Toniae Thomas
(74) *Attorney, Agent, or Firm* — Ishimaru & Associates LLP

(57) ABSTRACT

A method of manufacture of an integrated circuit packaging system includes: providing a stack board; connecting a device over the stack board; forming a stack encapsulant having a cavity and a pedestal over the device and having a shaped perimeter side from a pedestal surface of the pedestal to the stack board; and attaching a stack adhesive to a base package and the pedestal, the cavity and the shaped perimeter side providing a space for connections to the stack board.

18 Claims, 7 Drawing Sheets

INTEGRATED CIRCUIT PACKAGING SYSTEM WITH A STACK PACKAGE AND METHOD OF MANUFACTURE THEREOF

TECHNICAL FIELD

The present invention relates generally to an integrated circuit packaging system, and more particularly to systems with a stack package in package integrated circuit packaging system.

BACKGROUND ART

High performance and cost effective electronic based products and systems rely on the integrated circuit package to help to deliver solutions for use in products such as computer base products, global positioning systems (GPS), satellites, communication equipment, consumer products, and a vast line of other similar products that require small compact electronics supporting many complex functions.

A small product, such as a cell phone, can contain many integrated circuit packages, each having different sizes and shapes. Each of the integrated circuit packages within the cell phone can contain large amounts of complex circuitry. The circuitry within each of the integrated circuit packages work and communicate with other circuitry of other integrated circuit packages and electrical parts using electrical connections on circuit boards.

Products must compete in world markets and attract many consumers or buyers in order to be successful. It is very important for products to continue to improve in features, performance, and reliability while reducing product costs, product size, and equally important to be available quickly for purchase by the consumers or buyers.

Time to market, reliability, the number of integrated circuit packages, and the number of electrical parts on the circuit boards inside a product are important to improving the features, performance, and reliability of any product. Furthermore, the ways the circuitry and electrical connections are implemented have a direct impact on the availability, reliability, and costs of products.

Attempts have failed to provide a complete solution addressing simplified manufacturing processing, time to market, reliability, reduction of electrical parts on the circuit boards, size reductions of the circuit boards and the integrated circuit packages, with increased functionality, leveragability, and increased product features to the consumer.

Thus, a need remains for improvements with the integrated circuit packaging system for the world markets. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a stack board; connecting a device over the stack board; forming a stack encapsulant having a cavity and a pedestal over the device and having a shaped perimeter side from a pedestal surface of the pedestal to the stack board; and attaching a stack adhesive to a base package and the pedestal, the cavity and the shaped perimeter side providing a space for connections to the stack board.

The present invention provides an integrated circuit packaging system including: a stack board; a device connected over the stack board; a stack encapsulant formed with a cavity and a pedestal, over the device and with a shaped perimeter side of the stack encapsulant from a pedestal surface of the pedestal to the stack board; a stack adhesive attached over the pedestal; and a base package attached over the stack adhesive and with a space for connections to the stack board.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
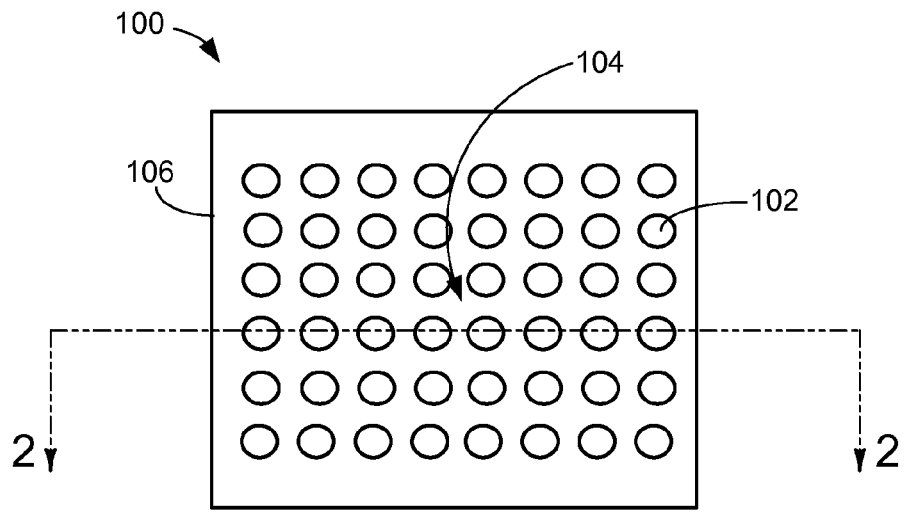
FIG. 1 is a bottom view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings shown for ease of description and generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "active side" refers to a side of a die, module, or package having active circuitry fabricated thereon or having elements for connection to the active circuitry within a die, a module, a package, or an electronic structure. The term "processing" as used herein includes deposition of material or photoresist, patterning, exposure, development, etching, cleaning, and/or removal of the material or photoresist as required in forming a described structure.

Referring now to FIG. 1, therein is shown a bottom view of an integrated circuit packaging system 100 in a first embodiment of the present invention. System interconnects 102, such as conductive balls, bumps, posts, or pin, can be attached over a system side 104 of a package substrate 106 such as a substrate or printed circuit board.

The integrated circuit packaging system 100 forms a package in a shape of a rectangle. It is understood that the integrated circuit packaging system 100 can be of any shape. For example, the integrated circuit packaging system 100 can be in a shape of a square.

Figure 2:
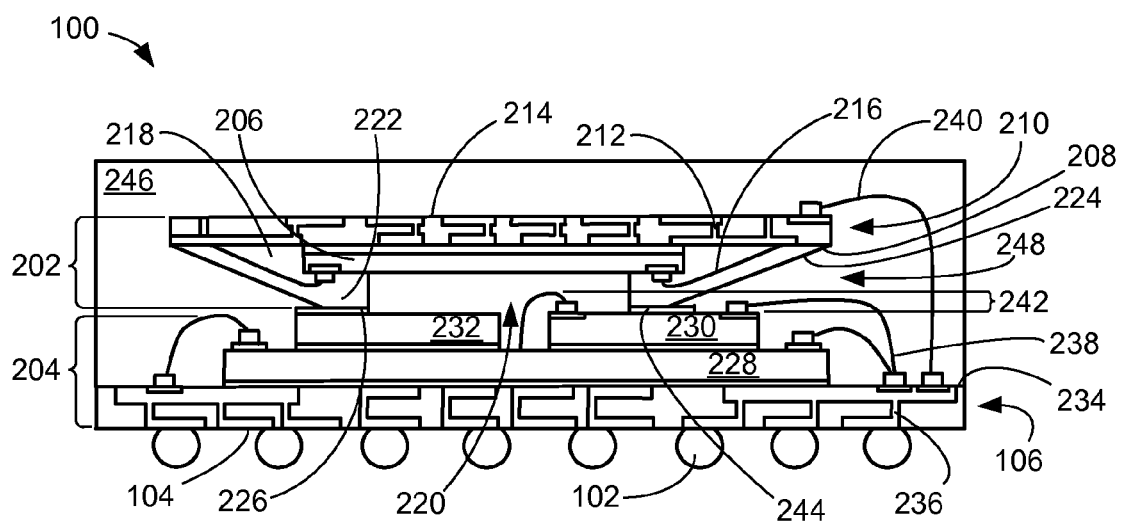
FIG. 2 is a cross-sectional view of the integrated circuit packaging system of the present invention taken along a line 2-2 of FIG. 1.

Referring now to FIG. 2, therein is shown a cross-sectional view of the integrated circuit packaging system 100 taken along a line 2-2 of FIG. 1. The integrated circuit packaging system 100 can preferably include a stack package 202 over a base package 204 and the system interconnects 102. The stack package 202 can have a length and a width smaller than a length and a width of the base package 204. The stack package 202 and the base package 204 can each be assembled independently in any order from one another.

The stack package 202 can preferably include a device 206 such as a die, wire bond chip, flip chip, module, or package. The device 206 can be connected over a first side 208 of a stack board 210, such as a substrate or printed circuit board. An active side of the device 206 facing away from the stack board 210 can have a geometric length and width smaller than the geometric length and width of the stack board 210.

The stack board 210 includes conductors 212 adjacent the first side 208, adjacent a second side 214 opposite the first side 208, or within the stack board 210. The conductors 212 such as traces, pads, contacts, or redistribution layers (RDL) within the stack board 210 can provide connectivity between the conductors 212 adjacent the first side 208 and the second side 214. The conductors 212 can be of any shape.

Circuitry of the device 206 can be connected with the stack board 210 using stack interconnects 216, such as wires, solder balls, solder bumps, or leads, attached between a perimeter of the active side of the device 206 and the first side 208.

A stack encapsulant 218 can cover or protect the stack interconnects 216, the first side 208, and portions of the active side of the device 206 connected to the stack interconnects 216. The stack encapsulant 218 can include a cavity 220, such as a hole, surrounded or adjacent pedestals 222. The stack encapsulant 218 can also include shaped perimeter sides 224.

The cavity 220 can be centered around or offset from a center point located on the active side of the device 206. The cavity 220 can expose the active side of the device 206 below the stack encapsulant 218.

The pedestals 222 can be formed above sections of the stack interconnects 216 directly over the device 206. Each of the pedestals 222 can include a pedestal surface 226 parallel with the active side of the device 206. An edge of the pedestal surface 226 can be joined with an edge of a side of the stack encapsulant 218 used to form the cavity 220. An edge of the pedestal surface 226, opposite the edge joined with the side of the stack encapsulant 218 used to form the cavity 220, can be joined with the shaped perimeter sides 224 of the stack encapsulant 218.

An edge of the shaped perimeter sides 224 opposite the edge joined with the pedestal surface 226 can intersect or join a perimeter of the first side 208. The shaped perimeter sides 224 are shown having a flat side that is oblique relative to the first side 208 of the stack board 210. The shaped perimeter sides 224 or the cavity 220 can provide additional clearance, such as gaps, distances, or separations, to eliminate contact or interference with other adjacent elements or components in a package stack configuration.

The shaped perimeter sides 224 can be formed having a surface such as flat surface, curved surface, angled surface, faceted surface, or of any surface shape. Furthermore, the shaped perimeter sides 224 can optionally be formed having multiple sides joined together with each of the sides oriented to provide the additional clearance.

The base package 204 can preferably include a lower integrated circuit 228, such as a die, wire bond chip, flip chip, module, or package, mounted over the package substrate 106 and an upper integrated circuit 230, such as a die, wire bond chip, flip chip, module, or package, adjacent a spacer 232 mounted over the lower integrated circuit 228. An active side of the lower integrated circuit 228 and of the upper integrated circuit 230 can be facing away from the package substrate 106.

The summation of dimensional lengths of the upper integrated circuit 230 and of the spacer 232, such as a thick adhesive, a heat sink, a pillar, a chip, or other similar element, can preferably be less than the dimensional length of the lower integrated circuit 228. Similarly, the summation of the dimensional widths of the upper integrated circuit 230 and of the spacer 232 can be less than the dimensional width of the lower integrated circuit 228. The thickness of the spacer 232 can be equal to the thickness of the upper integrated circuit 230.

The package substrate 106, such as a substrate or printed circuit board, includes the system side 104 and a component side 234 opposite the system side 104. A conductive trace 236 can be exposed on the system side 104, exposed on the component side 234, or imbedded within the package substrate 106 to provide connectivity between the conductive trace 236 exposed on the system side 104 and exposed on the component side 234. The system interconnects 102 can be attached to the conductive trace 236 exposed on the system side 104 to provide connectivity with a next level of system integration.

The active side of the lower integrated circuit 228 or of the upper integrated circuit 230 can be connected to the component side 234 of the package substrate 106 using internal interconnects 238 such as z-interconnects, bond wires, solder balls, or leads. The second side 214 of the stack board 210 can be connected to the component side 234 using vertical interconnects 240 such as z-interconnects, bond wires, or leads. A portion of the internal interconnects 238 connecting the upper integrated circuit 230 of the base package (204) with the component side 234 of the package substrate 106 can be located within the cavity 220 and between the upper integrated circuit 230 and the spacer 232.

A portion of the internal interconnects 238 can rise a measurable distance above the lower integrated circuit 228 or the upper integrated circuit 230. The largest measurable distance of the internal interconnects 238 can be referred to as a maximum loop height 242.

The pedestal surface 226 of the pedestals 222 can be attached to the active side of the upper integrated circuit 230 or to the spacer 232 using a stack adhesive 244 such as a reduced thickness internal stacking module adhesive (ISM), a thin adhesive film, a thin tape adhesive, or another thin adhesive having equivalent physical and bonding characteristics.

A package encapsulant 246 can preferably cover the stack package 202, the base package 204, the internal interconnects 238, the vertical interconnects 240, or a space 248. The package encapsulant 246 used to provide protection to the integrated circuit packaging system 100.

The space 248, such as a gap or separation, can be used to provide clearance between the internal interconnects 238 and other components such as the base package 204, the stack encapsulant 218, or the device 206. The space 248 can preferably be greater than the maximum loop height 242 to prevent contact, shorts, and assembly interference conditions with or to the internal interconnects 238.

It has been found that the shaped perimeter sides 224 and the cavity 220 can increase yields of the present invention. The shaped perimeter sides 224 can be formed to avoid shorts and interference between the pedestals 222 and any element such as the internal interconnects 238, pins, electrodes, posts, heat sinks, discrete parts, or vertical insertion areas (VIA). The avoidance of shorts and interference simplifies the manufacturing and improves the yield of stacked packaging systems.

It has been discovered that the present invention provides the integrated circuit packaging system 100 with a significantly reduced package profile height. The additional clearance provided by the shaped perimeter sides 224 or the cavity 220 enables the stack adhesive 244 to have a thickness of 25 micrometers compared to a conventional adhesive having a thickness of 85 micrometers. The present invention can provide a package profile height reduction of 60 micrometers in comparison with a comparable package having the identical circuitry using the conventional adhesive.

Furthermore, it has been discovered that the present invention provides the integrated circuit packaging system 100 with significant cost savings. The reduction of 60 micrometers in package profile height can reduce lengths of the vertical interconnects 240 and quantity of encapsulant material used to form the package encapsulant 246 resulting in manufacturing material savings.

Thus, it has been discovered that the integrated circuit packaging system 100 of the present invention furnishes important and heretofore unknown and unavailable solutions, capabilities, and functional aspects for package in package or package on package applications.

Figure 3:
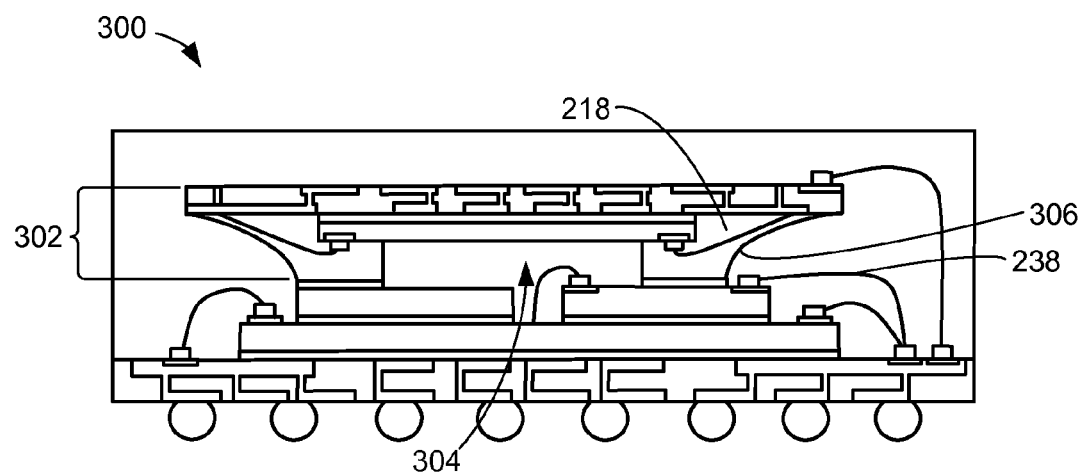
FIG. 3 is a cross-sectional view similar to FIG. 2 of an integrated circuit packaging system in a second embodiment of the present invention.

Referring now to FIG. 3, therein is shown a cross-sectional view similar to FIG. 2 of an integrated circuit packaging system 300 in a second embodiment of the present invention. The integrated circuit packaging system 300 can be similar to the integrated circuit packaging system 100 of FIG. 2 except the integrated circuit packaging system 300 can include a stack package 302 with a cavity 304 and shaped perimeter sides 306.

The cavity 304 can be identical to the cavity 220 of FIG. 2. The stack package 302 can be similar to the stack package 202 of FIG. 2 except the stack encapsulant 218 can include the shaped perimeter sides 306 having a concave curved surface to eliminate shorting of the internal interconnects 238.

It has been discovered that the shaped perimeter sides 306 having a curved surface can provide improved electrical performance characteristics. The curved surface of the shaped perimeter sides 306 can improve placement or separation of the internal interconnects 238. The improved placement or separation of the internal interconnects 238 can be used to limit proximity coupling effects, such as electromagnetic field (EMF), electromagnetic interference (EMI), or other signal coupling conditions, that can affect the electrical performance characteristics.

Figure 4:
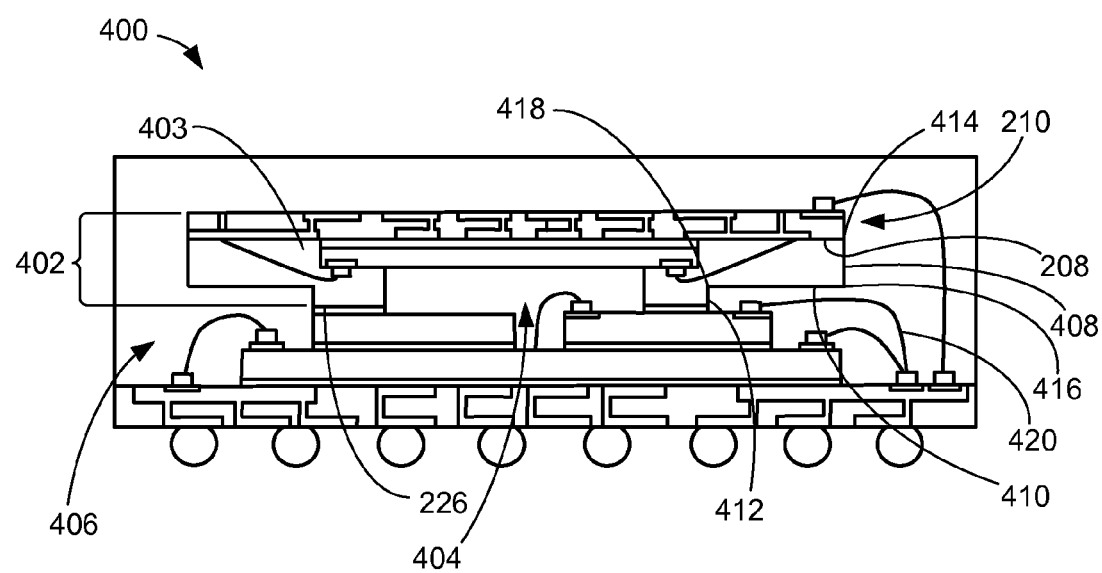
FIG. 4 is a cross-sectional view similar to FIG. 2 of an integrated circuit packaging system in a third embodiment of the present invention.

Referring now to FIG. 4, therein is shown a cross-sectional view similar to FIG. 2 of an integrated circuit packaging system 400 in a third embodiment of the present invention. The integrated circuit packaging system 400 can be similar to the integrated circuit packaging system 100 of FIG. 2 except the integrated circuit packaging system 400 can include a stack package 402. The stack package 402 includes a stack encapsulant 403 with a cavity 404 and shaped perimeter sides 406 having a first vertical side 408, a horizontal side 410, and a second vertical side 412.

The cavity 404 can be identical to the cavity 220 of FIG. 2. The first vertical side 408, the horizontal side 410, and the second vertical side 412 can each have a flat surface. A first top edge 414 of the first vertical side 408 can intersect the perimeter of the first side 208. An edge of the first vertical side 408 opposite the first top edge 414 can be joined with a side edge 416 of the horizontal side 410.

An edge of the horizontal side 410 opposite the side edge 416 can be joined with a second top edge 418 of the second vertical side 412. An edge of the second vertical side 412 opposite the second top edge 418 can be joined with an edge of the pedestal surface 226.

The first vertical side 408 can be coplanar with an edge of the stack board 210. The second vertical side 412 can be perpendicular with the pedestal surface 226. The horizontal side 410 can be parallel with the first side 208 and perpendicular with the first vertical side 408 and the second vertical side 412.

It has been found that the shaped perimeter sides 406 can be used with internal interconnects 420 that are formed having horizontal portions longer than vertical portions. The shaped perimeter sides 406 can be used to provide the integrated circuit packaging system 400 with capabilities to support the internal interconnects 420 with low z-height, horizontally dominant routed, characteristics.

Figure 5:
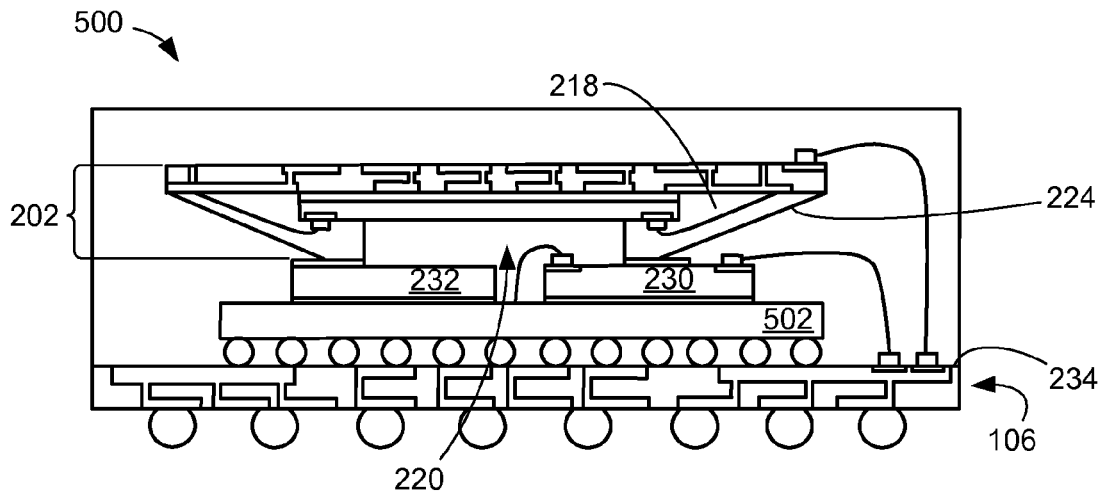
FIG. 5 is a cross-sectional view similar to FIG. 2 of an integrated circuit packaging system in a fourth embodiment of the present invention.

Referring now to FIG. 5, therein is shown a cross-sectional view similar to FIG. 2 of an integrated circuit packaging system 500 in a fourth embodiment of the present invention. The integrated circuit packaging system 500, similar to the integrated circuit packaging system 100 of FIG. 2, is shown having a flip chip 502 mounted over the package substrate 106 instead of the lower integrated circuit 228 of FIG. 2.

An active side of the flip chip 502 can be connected to the component side 234 of the package substrate 106. The upper integrated circuit 230 adjacent the spacer 232 can be mounted over a side the flip chip 502 opposite the active side of the flip chip 502. An active side of the upper integrated circuit 230 facing away from the flip chip 502.

The stack package 202 with the stack encapsulant 218 having the cavity 220 and the shaped perimeter sides 224 is shown mounted over the upper integrated circuit 230 adjacent the spacer 232.

Figure 6:
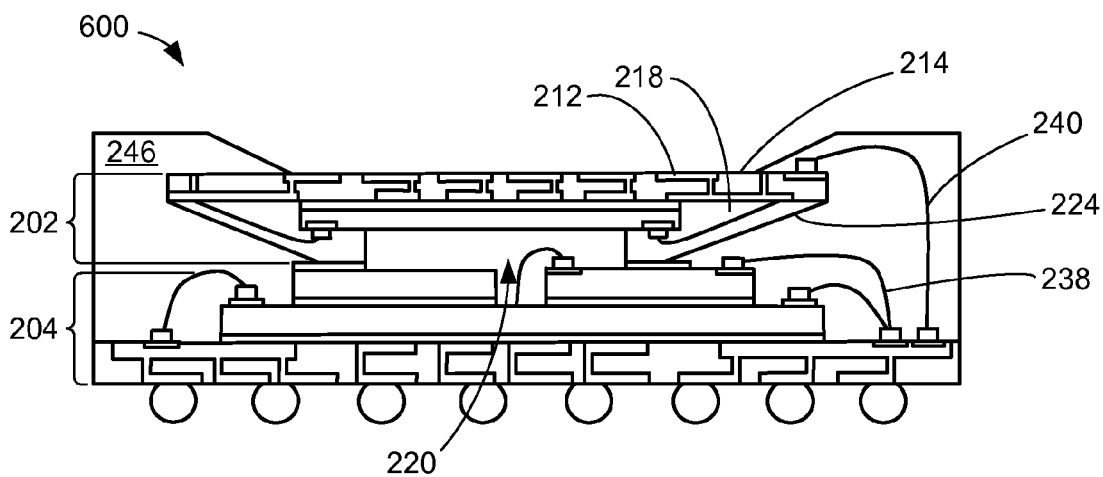
FIG. 6 is a cross-sectional view similar to FIG. 2 of an integrated circuit packaging system in a fifth embodiment of the present invention.

Referring now to FIG. 6, therein is shown a cross-sectional view similar to FIG. 2 of an integrated circuit packaging system 600 in a fifth embodiment of the present invention. The integrated circuit packaging system 600 can be similar to the integrated circuit packaging system 100 of FIG. 2 except the package encapsulant 246 of the integrated circuit packaging system 600 can cover the base package 204, the internal interconnects 238, the vertical interconnects 240, and portions of the stack package 202.

The stack package 202 with the stack encapsulant 218 having the cavity 220 and the shaped perimeter sides 224 is shown mounted over the base package 204. The portions of the second side 214 of the stack package 202 physically attached to the vertical interconnects 240 can be covered with the package encapsulant 246. Areas of the conductors 212 adjacent the second side 214 not physically attached to the vertical interconnects 240 can be exposed and free of the package encapsulant 246.

It has been found that the conductors 212 exposed of the package encapsulant 246 adjacent the second side 214 can provide the integrated circuit packaging system 600 with extended application capabilities. Another component, such as a package, module, active assembly, passive assembly, or combination thereof, can be mounted over or connected to the conductors 212 exposed on the integrated circuit packaging system 600 to provide a fan-in package over package (Fi-POP) subsystem solution.

Figure 7:
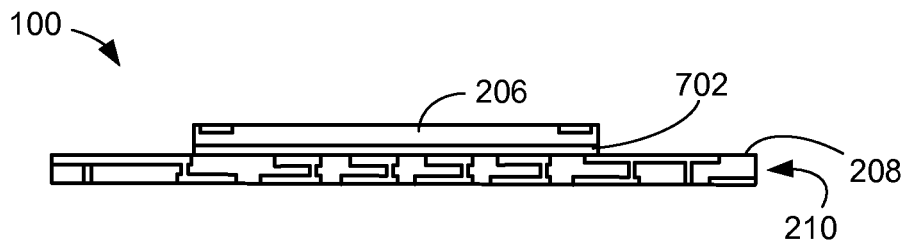
FIG. 7 is the cross-sectional view of the integrated circuit packaging system of FIG. 2 in a mounting phase of the device.

Referring now to FIG. 7, therein is shown the cross-sectional view of the integrated circuit packaging system 100 of FIG. 2 in a mounting phase of the device 206. The device 206 can be mounted over the first side 208 of the stack board 210 using a mounting process with a bonding material 702 such as a eutectic reaction layer or an adhesive layer. The active side of the device 206 oriented to face away from the first side 208.

Figure 8:
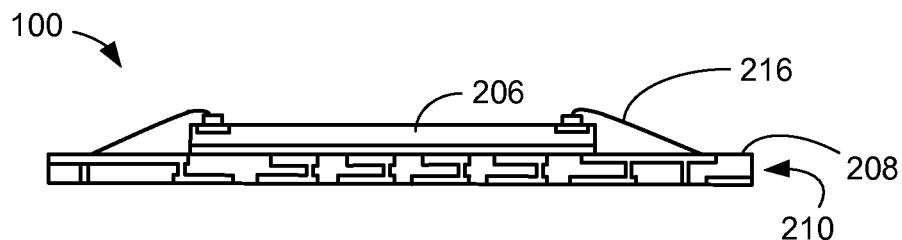
FIG. 8 is the structure of FIG. 7 in a connecting phase of the device.

Referring now to FIG. 8, therein is shown the structure of FIG. 7 in a connecting phase of the device 206. The stack interconnects 216 can be connected between the active side of the device 206 and the first side 208 of the stack board 210 using a connecting process such as thermocompression, ultrasonic, thermosonic, wedge bonding, wire bonding, ball bonding, solder reflowing, or other similar connection processes.

Figure 9:
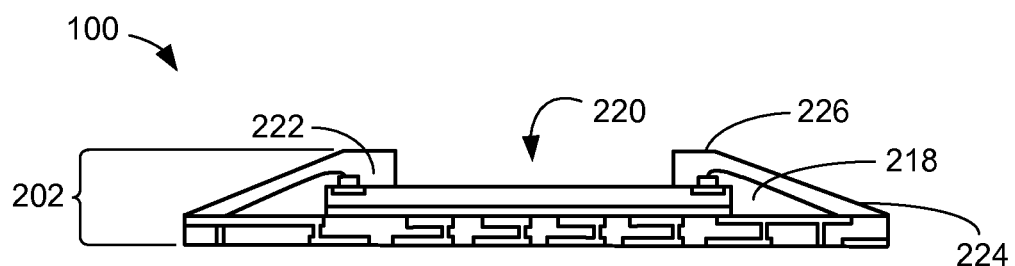
FIG. 9 is the structure of FIG. 8 in an encapsulating phase of the stack package.

Referring now to FIG. 9, therein is shown the structure of FIG. 8 in an encapsulating phase of the stack package 202. The structure of FIG. 8 can be enclosed within a forming or molding fixture (not shown) and filled with the stack encapsulant 218. The molding fixture confines or forms the stack encapsulant 218 around the structure forming the cavity 220, the pedestals 222, the shaped perimeter sides 224, and the pedestal surface 226 of the stack encapsulant 218.

The stack encapsulant 218 is allowed to set using a settling process. The molding fixture is removed. The stack encapsulant 281 is cured using a process such as a curing process completing the manufacturing process of the stack package 202.

Figure 10:
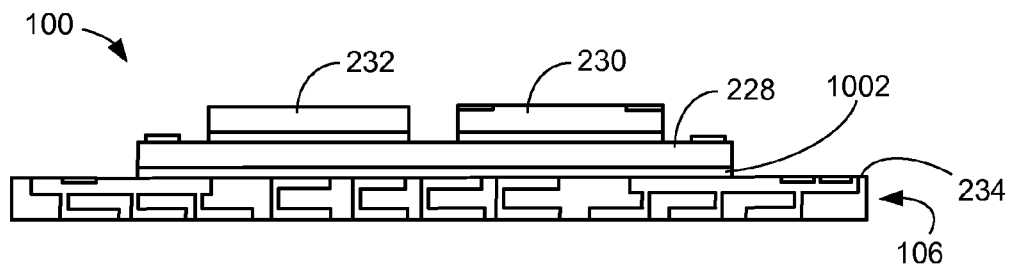
FIG. 10 is the cross-sectional view of the integrated circuit packaging system of FIG. 2 in a mounting phase of the package substrate.

Referring now to FIG. 10, therein is shown the cross-sectional view of the integrated circuit packaging system of FIG. 2 in a mounting phase of the package substrate 106. The lower integrated circuit 228 can be mounted over the package substrate 106. The upper integrated circuit 230 adjacent the spacer 232 can be mounted over the lower integrated circuit 228. The active side of the lower integrated circuit 228 and of the upper integrated circuit 230 can be facing away from the package substrate 106.

The lower integrated circuit 228, the upper integrated circuit 230, and the spacer 232 can be mounted using a mounting process with a bonding material 1002 such as a eutectic reaction layer or an adhesive layer.

Figure 11:
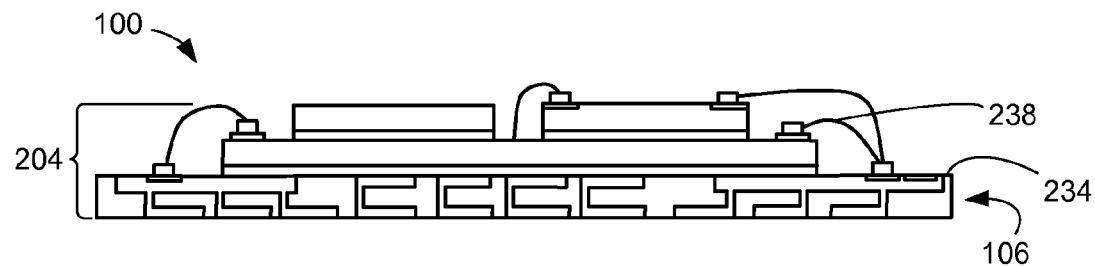
FIG. 11 is the structure of FIG. 10 in a connecting phase of the package substrate.

Referring now to FIG. 11, therein is shown structure of FIG. 10 in a connecting phase of the package substrate 106. The internal interconnects 238 can connect the active side of the lower integrated circuit 228 or of the upper integrated circuit 230 with the component side 234 of the package substrate 106 using the connecting process resulting in the base package 204.

Figure 12:
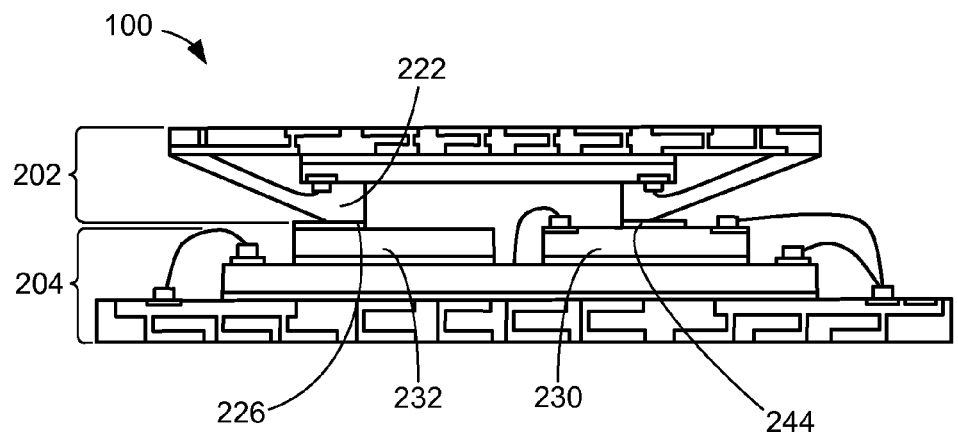
FIG. 12 is the structure of FIG. 11 in an attaching phase of the stack package.

Referring now to FIG. 12, therein is shown the structure of FIG. 11 in an attaching phase of the stack package 202. The stack package 202 can be oriented with the pedestals 222 facing the base package 204. The pedestal surface 226 of the pedestals 222 can be attached over a side of the stack adhesive 244 using an attaching process.

A side of the stack adhesive 244 opposite the side attached to the pedestals 222 can be attached over the active side of the upper integrated circuit 230 or over the spacer 232 of the base package 204 using the attaching process.

Figure 13:
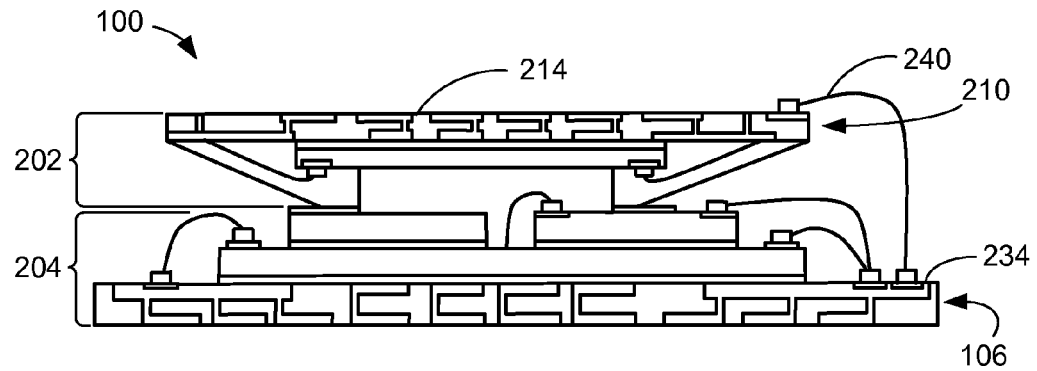
FIG. 13 is the structure of FIG. 12 in a connecting phase of the stack package.

Referring now to FIG. 13, therein is shown the structure of FIG. 12 in a connecting phase of the stack package 202. The stack package 202 can be electrically connected with the base package 204. The second side 214 of the stack board 210 can be connected to the component side 234 of the package substrate 106 using the vertical interconnects 240. The vertical interconnects 240 can be connected using the connecting process.

Figure 14:
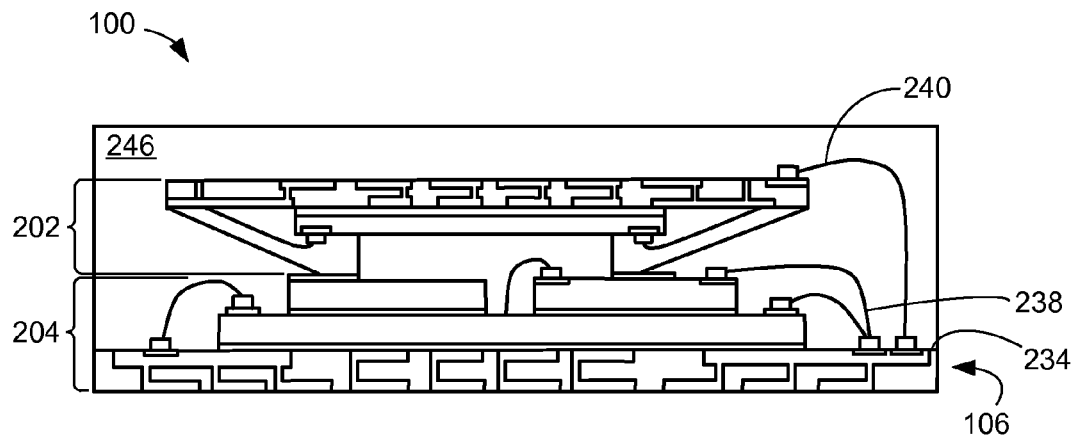
FIG. 14 is the structure of FIG. 13 in an encapsulating phase of the stack package and the base package.

Referring now to FIG. 14, therein is shown the structure of FIG. 13 in an encapsulating phase of the stack package 202 and the base package 204. The structure of FIG. 13 can be enclosed within a molding fixture (not shown) and filled with the package encapsulant 246. The package encapsulant is formed or molded to cover the stack package 202, the vertical interconnects 240, the internal interconnects 238, and the component side 234 of the package substrate 106.

The package encapsulant 246 is allowed to set using a settling process. The molding fixture is removed. The package encapsulant 246 is cured using a process such as a curing process.

Figure 15:
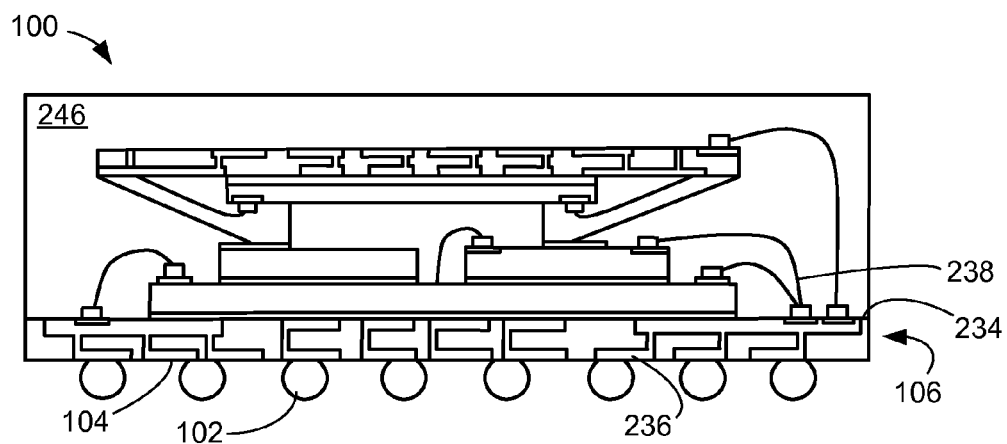
FIG. 15 is the structure of FIG. 14 in an attaching phase of the system interconnects.

Referring now to FIG. 15, therein is shown the structure of FIG. 14 in an attaching phase of the system interconnects 102. The system interconnects 102 can be attached to the conductive trace 236 exposed on the system side 104 using the connecting process to complete the manufacturing process the integrated circuit packaging system 100.

Figure 16:
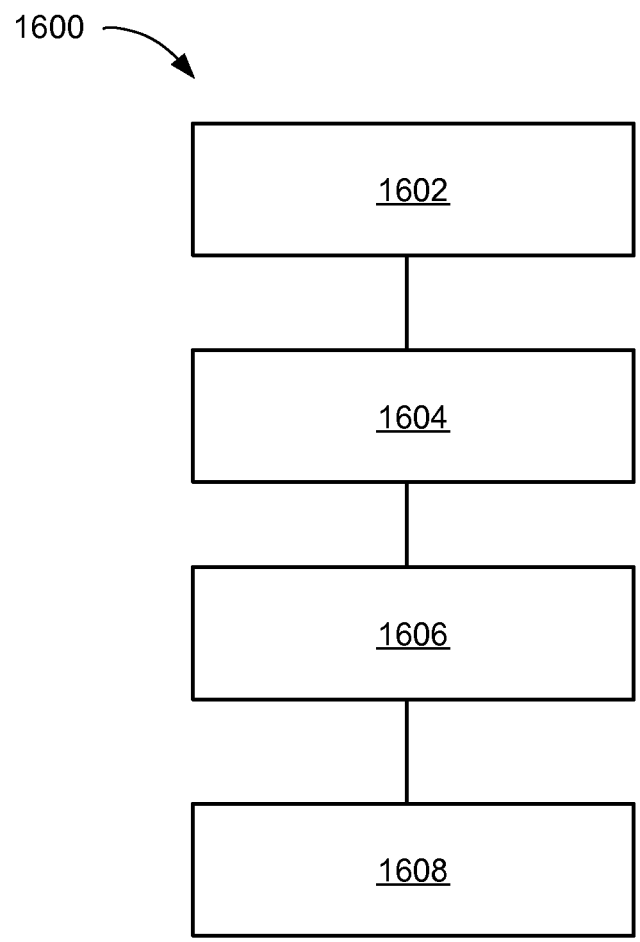
FIG. 16 is a flow chart of a method of manufacture of an integrated circuit packaging system in a further embodiment of the present invention.

Referring now to FIG. 16, therein is shown a flow chart of a method 1600 of manufacture of an integrated circuit packaging system 100 in a further embodiment of the present invention. The method 1600 includes providing a stack board in a block 1602; connecting a device over the stack board in a block 1604; forming a stack encapsulant having a cavity and a pedestal over the device and having a shaped perimeter side from a pedestal surface of the pedestal to the stack board in a block 1606; and attaching a stack adhesive to a base package and the pedestal, the cavity and the shaped perimeter side providing a space for connections to the stack board in a block 1608.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    providing a stack board;
    connecting a device over the stack board;
    forming a stack encapsulant having a cavity and a pedestal over the device and having a shaped perimeter side from a pedestal surface of the pedestal to the stack board;
    forming a base package having an upper integrated circuit and a package substrate;
    attaching a stack adhesive to the base package and the pedestal, the cavity and the shaped perimeter side providing a space for connections to the stack board; and
    connecting an internal interconnect to the upper integrated circuit and the package substrate, a portion of the internal interconnect within the cavity of the stack encapsulant.

2. The method as claimed in claim 1 wherein forming the stack encapsulant includes forming the shaped perimeter side having a curved shape.

3. The method as claimed in claim 1 wherein forming the stack encapsulant with the shaped perimeter side includes forming the shaped perimeter side with multiple sides.

4. The method as claimed in claim 1 further comprising forming a package encapsulant over a portion of the stack board.

5. A method of manufacture of an integrated circuit packaging system comprising:
    providing a stack board;
    connecting a device over the stack board;
    forming a stack encapsulant having a cavity and a pedestal over the device and having a shaped perimeter side from a pedestal surface of the pedestal to the stack board;
    forming a base package having an upper integrated circuit, a spacer, and a package substrate;
    attaching a stack adhesive to the base package and the pedestal, the cavity and the shaped perimeter side providing a space for connections to the stack board;
    connecting an internal interconnect between the upper integrated circuit and the package substrate the internal interconnect next to the spacer;
    attaching a vertical interconnect between the stack board and the base package; and
    forming a package encapsulant over the vertical interconnect, over the base package, over the stack board, and surrounding the stack encapsulant.

6. The method as claimed in claim 5 wherein attaching the stack adhesive includes attaching the stack adhesive having a thickness less than 50 micrometers.

7. The method as claimed in claim 5 wherein forming the stack encapsulant with the shaped perimeter side includes forming the shaped perimeter side having a first vertical side, a horizontal side, and a second vertical side joined with one another.

8. The method as claimed in claim 5 wherein forming the package encapsulant includes forming the package encapsulant with a portion of the stack board substantially exposed.

9. An integrated circuit packaging system comprising: a stack board; a device connected over the stack board; a stack encapsulant formed with a cavity and a pedestal, over the device and with a shaped perimeter side of the stack encapsulant from a pedestal surface of the pedestal to the stack board; a stack adhesive attached over the pedestal; a base package having an upper integrated circuit and a package substrate attached over the stack adhesive and with a space for connections to the stack board; and an internal interconnect to the upper integrated circuit and the package substrate, a portion of the internal interconnect within the cavity of the stack encapsulant.

10. The system as claimed in claim 9 wherein the stack adhesive has a thickness less than 85 micrometers.

11. The system as claimed in claim 9 wherein the shaped perimeter side is formed with multiple sides.

12. The system as claimed in claim 9 further comprising a package encapsulant formed over portions of the stack board.

13. The system as claimed in claim 9 wherein the stack encapsulant is formed having a spacing from the base package.

14. The system as claimed in claim 9 further comprising:
    a vertical interconnect between the stack board and the base package; and
    a package encapsulant over the vertical interconnect, over the base package, over the stack board, and surrounding the stack encapsulant.

15. The system as claimed in claim 14 wherein the stack adhesive is less than 50 micrometers thick.

16. The system as claimed in claim 14 wherein the shaped perimeter side has a first vertical side, a horizontal side, and a second vertical side joined with one another.

17. The system as claimed in claim 14 wherein the package encapsulant is formed with a portion of the stack board substantially exposed.

18. The system as claimed in claim 14 wherein the shaped perimeter side has a space for an internal interconnect.

* * * * *